(12) United States Patent
Vianen et al.

(10) Patent No.: US 11,322,374 B2
(45) Date of Patent: May 3, 2022

(54) OPTICAL STATION FOR EXCHANGING OPTICAL ELEMENTS (71) Applicant: ASM Technology Singapore Pte Ltd, Singapore (SG)

(72) Inventors: Job Vianen, Nijmegen (NL); Ralf Petrus Francis Noijen, Deurne (NL); Gerrit Arie Van Ooik, Nuenen (NL); Marius Van Der Does, Eindhoven (NL)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 740 days.

(21) Appl. No.: 15/248,282

(22) Filed: Aug. 26, 2016

(65) Prior Publication Data

US 2017/0062247 A1 Mar. 2, 2017

(30) Foreign Application Priority Data

Sep. 2, 2015 (EP) ..................... 15002577

(51) Int. Cl.
*H01L 21/67* (2006.01)
*B23K 26/064* (2014.01)
(Continued)

(52) U.S. Cl.
CPC ...... *H01L 21/67092* (2013.01); *B23K 26/064* (2015.10); *B23K 26/364* (2015.10);
(Continued)

(58) Field of Classification Search
CPC ............ H01L 21/67092; B23K 26/064; B23K 26/364; B23K 2103/56; B23K 2101/40;
(Continued)

(56) References Cited

U.S. PATENT DOCUMENTS 4,661,680 A * 4/1987 Swensrud .......... B23K 26/0884
219/121.78
5,128,808 A * 7/1992 Dosaka ................... G02B 7/16
359/233

(Continued)

FOREIGN PATENT DOCUMENTS

WO WO 2010/111799 A1 10/2010
WO WO 2014/064492 A1 5/2014

OTHER PUBLICATIONS

Search Report dated Mar. 23, 2016 issued in corresponding European Patent Application No. 15002577.3.

*Primary Examiner* — Joel M Attey
*Assistant Examiner* — Yeong Juen Thong
(74) *Attorney, Agent, or Firm* — Ostrolenk Faber LLP (57) ABSTRACT An optical station for a laser processing device including a plurality of holders for holding respective optical elements; a rotatable magazine having a plurality of accommodation spaces for accommodating the plurality of holders; a positioning device having a holder clamp for clamping and positioning a selected one of the optical elements. a magazine actuator for rotating the magazine; linear shifting means for shifting the magazine in a direction parallel to the optical axis, wherein the magazine is shifted towards the positioning device such that the positioning device lifts the holder from its accommodation space.

17 Claims, 9 Drawing Sheets (51) Int. Cl.
    *B23K 26/364*    (2014.01)
    *G02B 7/16*    (2021.01)
    *B23K 101/40*    (2006.01)
    *B23K 103/00*    (2006.01)

(52) U.S. Cl.
    CPC ............ *G02B 7/16* (2013.01); *B23K 2101/40* (2018.08); *B23K 2103/56* (2018.08)

(58) Field of Classification Search
    CPC .............. B23K 26/362; B23K 26/1482; B23K 26/0648; G02B 7/16; G02B 7/003; G02B 7/02; B23Q 3/15506; B23Q 3/15566; B23Q 3/155; B23Q 3/15793; B23Q 3/157
    USPC ................... 219/121.82; 359/201.1; 438/463
    See application file for complete search history.

(56) References Cited

U.S. PATENT DOCUMENTS

| | | | | |
|---|---|---|---|---|
| 5,610,684 | A * | 3/1997 | Shiraishi | G03F 7/70241 355/55 |
| 5,844,666 | A * | 12/1998 | Van Engelen | G03F 7/70241 355/72 |
| 6,323,995 | B1 * | 11/2001 | Takahama | G02B 7/003 359/371 |
| 6,359,256 | B1 * | 3/2002 | Biermann | B23K 26/1482 219/121.75 |
| 2005/0263508 | A1 * | 12/2005 | Yamazaki | B23K 26/1482 219/121.84 |
| 2008/0058187 | A1 * | 3/2008 | Yamazaki | B23K 26/0884 483/16 |
| 2008/0316444 | A1 * | 12/2008 | Sorg | G03F 7/70308 355/52 |
| 2009/0179014 | A1 * | 7/2009 | Erlenmaier | B23K 26/1482 219/121.67 |
| 2011/0063724 | A1 * | 3/2011 | Hasegawa | G02B 21/248 359/381 |
| 2012/0012594 | A1 * | 1/2012 | Boegli | B23K 26/40 220/674 |
| 2012/0218635 | A1 * | 8/2012 | Suzuka | G02B 7/14 359/554 |
| 2013/0334183 | A1 * | 12/2013 | Paganelli | B23K 26/064 219/121.75 |

\* cited by examiner

OPTICAL STATION FOR EXCHANGING OPTICAL ELEMENTS

FIELD OF THE INVENTION

The present invention relates in general to the field of processing by means of a laser beam, more particularly the field of laser grooving and/or laser dicing of wafers.

BACKGROUND OF THE INVENTION

Miniaturization of electronic components has led to various improvements in semiconductor technology to make electronic components ever-smaller. Such components may include simple components such as diodes, up to complex components such as integrated circuits. Apart from electronic components, mechanical components can also be manufactured using the same technology.

In the art of semiconductor technology, it is commonly known that a wafer of semiconductor material, typically silicon, is processed to form the components in a surface area of the wafer. The wafer is macroscopic, having a diameter ranging in the order of 20-300 mm, while the components are microscopic, typically having a size in the sub-millimeter range. Each component is made in a small wafer portion, with the various wafer portions being located at a small distance from each other. After the processing steps, the wafer is cut to separate the various wafer portions from each other, so that the components become available independent from each other. After separation, each separated wafer portion is referred to as a die, and the separation process is known as dicing. The present invention relates particularly to the field of laser dicing.

The various wafer portions are typically arranged in a matrix pattern, separated by mutually orthogonal lanes, also indicated as "dicing streets". The separation process involves applying a cut in each dicing street. At least part of the cutting is done by radiation: radiation, typically a high power laser beam, is used to remove the top layer of the dicing streets; this is also indicated as "radiative grooving", or more conveniently as "laser grooving". The present invention relates also to a method of laser grooving.

In the process of laser grooving and/or lacer dicing, a laser beam and a wafer are moved with respect to each other. This relative movement may be practiced by holding the wafer stationary and moving the laser beam, or by holding the laser beam and moving the wafer, or both. In practice, it is more convenient to hold the optical system stationary and move the wafer; nevertheless, the movement will be indicated as a "scribing" movement of the laser beam.

Scribing is done in two directions. For instance, after having scribed a first groove in one direction, the next groove is scribed in the opposite direction. For optimum processing, an optical element in the laser path is then rotated over 180°; thus, it is desirable to be able to quickly rotate the optical element. It may also be desirable to exchange the optical element for a second optical element. It is further noted that, while the background of the invention is in the field of processing wafers, the present invention is also applicable in other types of laser processing apparatus that require more that one diffractive (or other) optical element and/or that require the optical element to be rotated quickly.

In order to be able to quickly change from one optical element to another optical element, a laser processing device comprises an optical station with a magazine holding a supply of optical elements and a positioning device for positioning one selected optical element in the optical path. Further, during processing, the positioning device is able to rotate the selected optical element about the optical axis.

In the prior art, the magazine can hold only two optical elements. A practically desired range of optical elements involves however more than two elements, and it is therefore necessary to manually exchange elements in the magazine.

In the prior art, the exchange of an element from the magazine to the laser path is time-consuming, reducing the net output of the machine.

In the prior art, rotating the operational optical element about the optical axis requires rotating of the entire magazine. In the prior art, the holding element of the optical element covers proper retainment/positioning of the element both in the magazine and on the rotating mechanism in the laser path. Besides the positioning a sliding mechanism is used to exchange holders from the magazine to the rotating mechanism. The magazine, the holder and the sliding mechanism are rotated during processing. The inertia of this combination does not allow fast rotating of the optical element during processing resulting in lower output.

In the prior art, the rotation of the optical element is limited to 180°, therefore limiting the freedom of patterning with the optical element during processing.

SUMMARY OF THE INVENTION

An object of the present invention is to provide an optical station suitable for use in a laser grooving device or a laser dicing device that allows multiple optical elements to be selected from an integrated magazine.

A further object of the present invention is to provide an optical station suitable for use in a laser grooving device or a laser dicing device in which the positioning of the optical element in a holder in the magazine is such that no additional handling of the holder is required, and the holder is directly placed on the rotating device with accurate positioning during hand-over.

A further object of the present invention is to provide an optical station suitable for use in a laser grooving device or a laser dicing device in which the rotating device contains a positioning reference for the holder.

A further object of the present invention is to provide an optical station suitable for use in a laser grooving device or a laser dicing device in which the position of optical elements in the magazine is not critical.

A further object of the present invention is to provide an optical station suitable for use in a laser grooving device or a laser dicing device in which the optical element can be rotated freely over an angle of 360° or more, at relatively high speed.

A further object of the present invention is to provide an optical station suitable for use in a laser grooving device or a laser dicing device in which an optical element in the magazine can be easily and quickly replaced manually, with little or no positional accuracy of the optical element in the magazine being required.

In order to meet at least one of the above objectives, the present invention provides an optical station for a laser processing device having an optical path, the optical station having a positioning axis that is intended to coincide with the optical path of the laser processing device, the optical station comprising:

a plurality of holders for holding respective optical elements;

a positioning device having a holder clamp for clamping and positioning a selected one of the holders such as to position the corresponding optical element in the optical path;

a magazine having a plurality of accommodation spaces for accommodating the plurality of holders, wherein the magazine is configured to be displaceable in a virtual XY-plane perpendicular to the positioning axis, and wherein the magazine and the holder clamp are configured to be displaceable with respect to each other in a Z-direction parallel to the positioning axis;

a magazine XY-actuator for displacing the magazine perpendicular to the positioning axis with respect to the positioning device;

a magazine Z-actuator for effecting a relative Z-displacement of the magazine and the holder clamp with respect to each other, between a relative distal extreme position and a relative proximal extreme position;

wherein, when the magazine and the holder clamp are in the relative distal extreme position, the magazine is operative to lift a holder from the holder clamp and is displaceable in the XY-direction to select another holder; and wherein, when the magazine and the holder clamp are in the relative proximal extreme position, the holder clamp is operative to lift the selected holder from the magazine for accurately positioning the selected holder with respect to the positioning axis.

BRIEF DESCRIPTION OF THE DRAWINGS

These and other aspects, features and advantages of the present invention will be further explained by the following description of one or more preferred embodiments with reference to the drawings, in which same reference numerals indicate same or similar parts, and in which.

DETAILED DESCRIPTION OF THE INVENTION

Figure 1A:
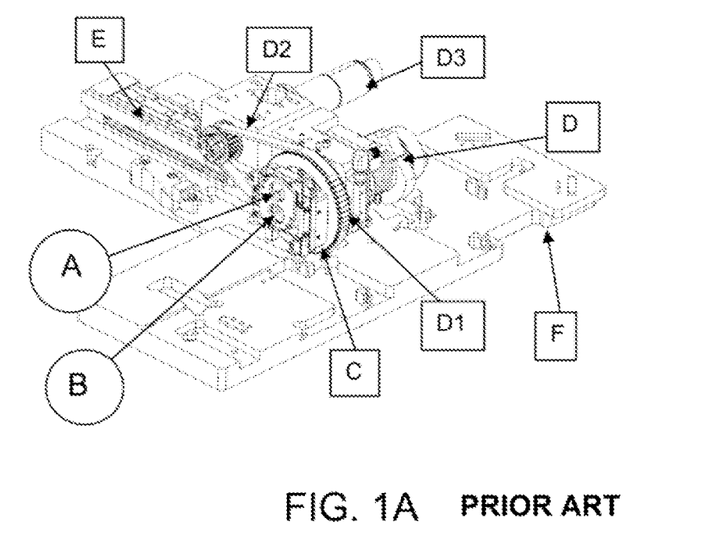
FIG. 1A schematically shows a perspective view of a portion of a prior art optical station.
Figure 1B:
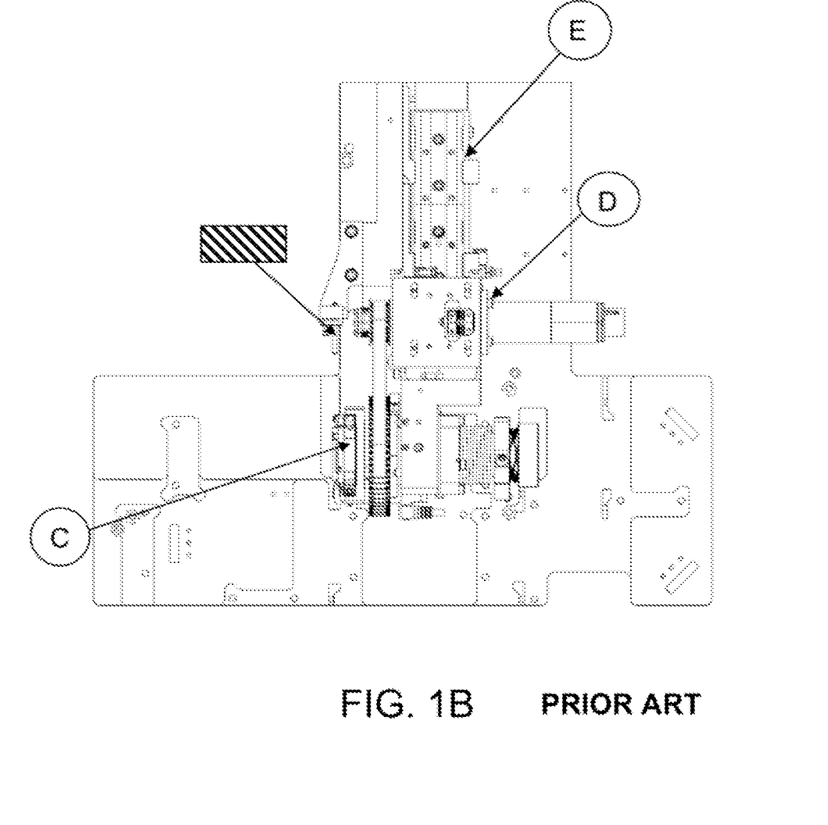
FIG. 1B is a schematic top view of the device portion shown in FIG. 1A.

FIG. 1A schematically shows a perspective view of a portion of a prior art laser grooving device, and FIG. 1B is a schematic top view of that device portion. The figures show a magazine C holding two optical elements A and B, mounted on a rotational device D. The rotational device D comprises a support disc D1, rotated by a motor D3 via a belt D2. The rotational device D is mounted on a slider E. Reference F indicates a frame of the grooving device. In operation, a wafer (not shown) to be processed will be fixed with respect to this frame F. The slider E is mounted on the frame F, and allows the rotational device D to be displaced with respect to the frame F and hence with respect to the wafer.

FIGS. 2A-D are sketches schematically illustrating the operation of the prior art device of FIGS. 1A-B.

Figure 2A:
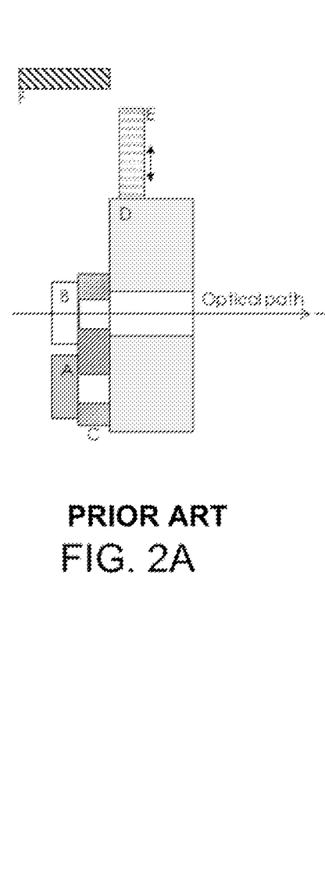
FIGS. 2A-2D are sketches schematically illustrating the operation of the prior art device of FIGS. 1A-B.

FIG. 2A shows the optical path, which is fixed with respect to the frame F. The magazine C and the rotational device D have passages aligned with the optical path for allowing the laser beam (not shown) to pass. In this situation, magazine C is in a bottom position and optical element B is aligned with the optical path.

Figure 2B:
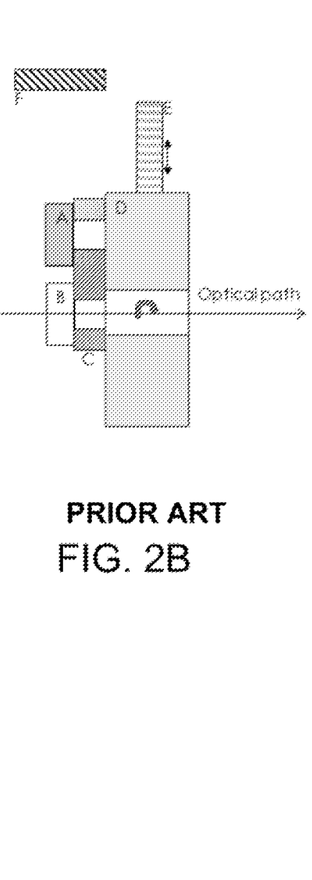

FIG. 2B illustrates that the rotational device D has made the magazine C perform a 180° turn.

Figure 2C:
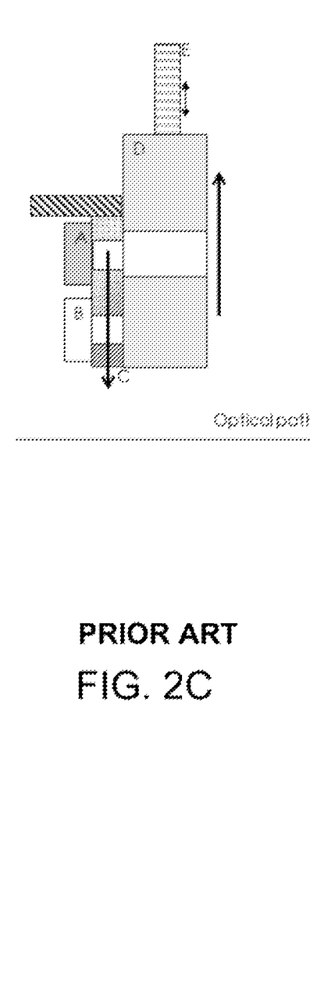

FIG. 2C illustrates that the slider E has displaced the rotational device D and the magazine C upwards. A blocking device blocks the movement of the magazine C, so that effectively the magazine C is shifted down with respect to the rotational device D.

Figure 2D:
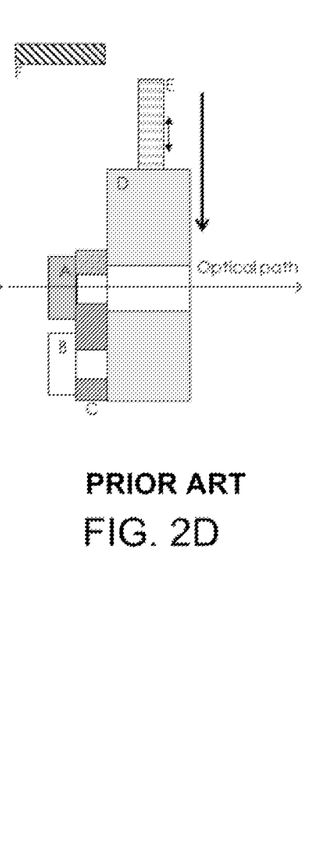

FIG. 2D illustrates that the slider E has displaced the rotational device D and the magazine C back downwards. The end situation is the same as FIG. 2A, but now with optical element A being aligned with the optical path.

Figure 3A:
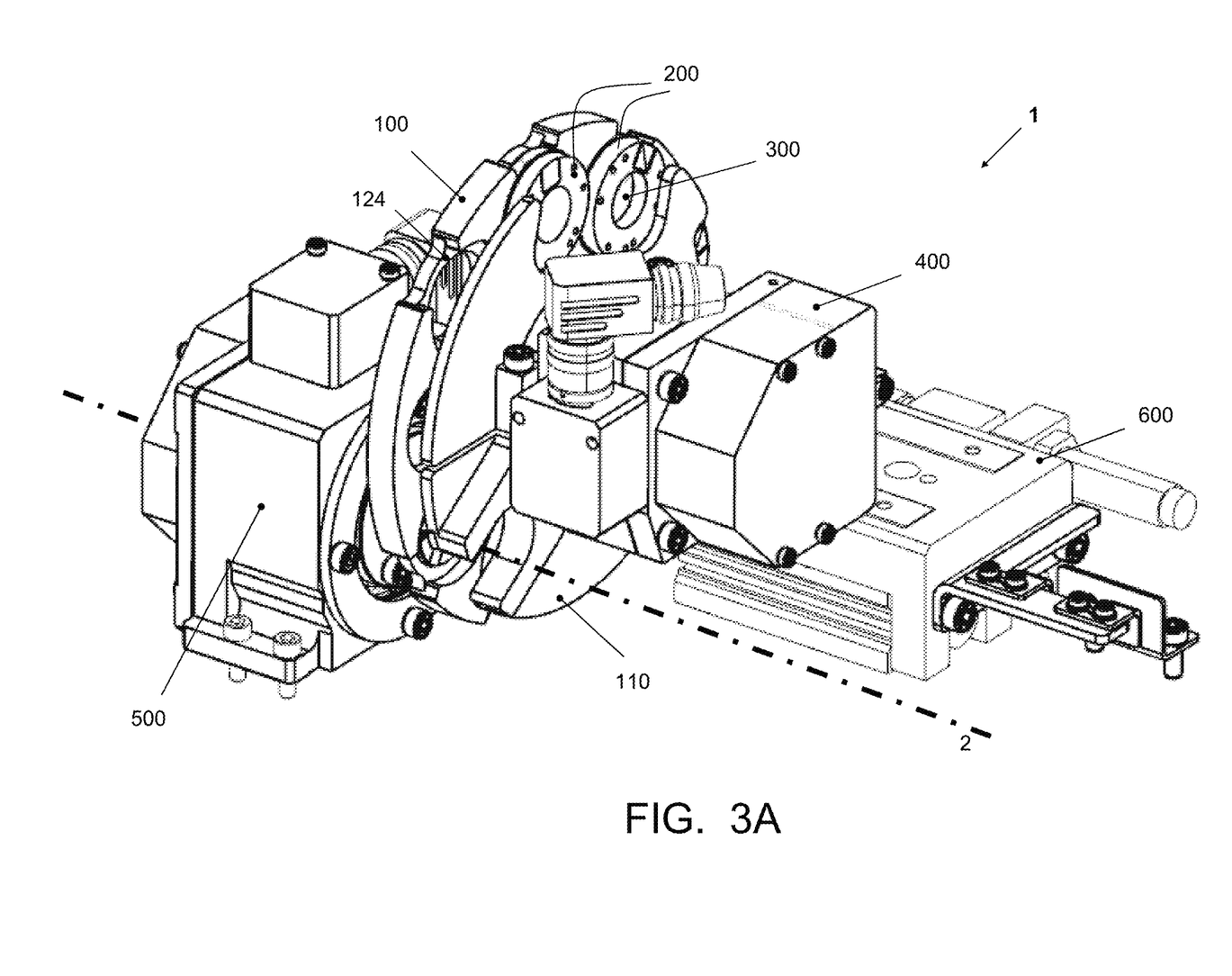
FIGS. 3A and 3B are schematic perspective views of an embodiment of an optical station according to the present invention.

FIG. 3A is a schematic perspective view of an optical station 1 according to the present invention, intended for use in a laser grooving apparatus, or more generally in a laser processing device. Such apparatus has an optical path that is defined by the components of that apparatus, and that will have a fixed position with respect to a machine reference such as a machine frame. The optical station 1 has a positioning axis 2 that coincides with the optical path of the laser processing device if the optical station is mounted correctly. This positioning axis might be called the "optical axis of the optical station", but will be termed "positioning axis" to avoid confusion with the "optical axis" of the processing device.

Figure 3B:
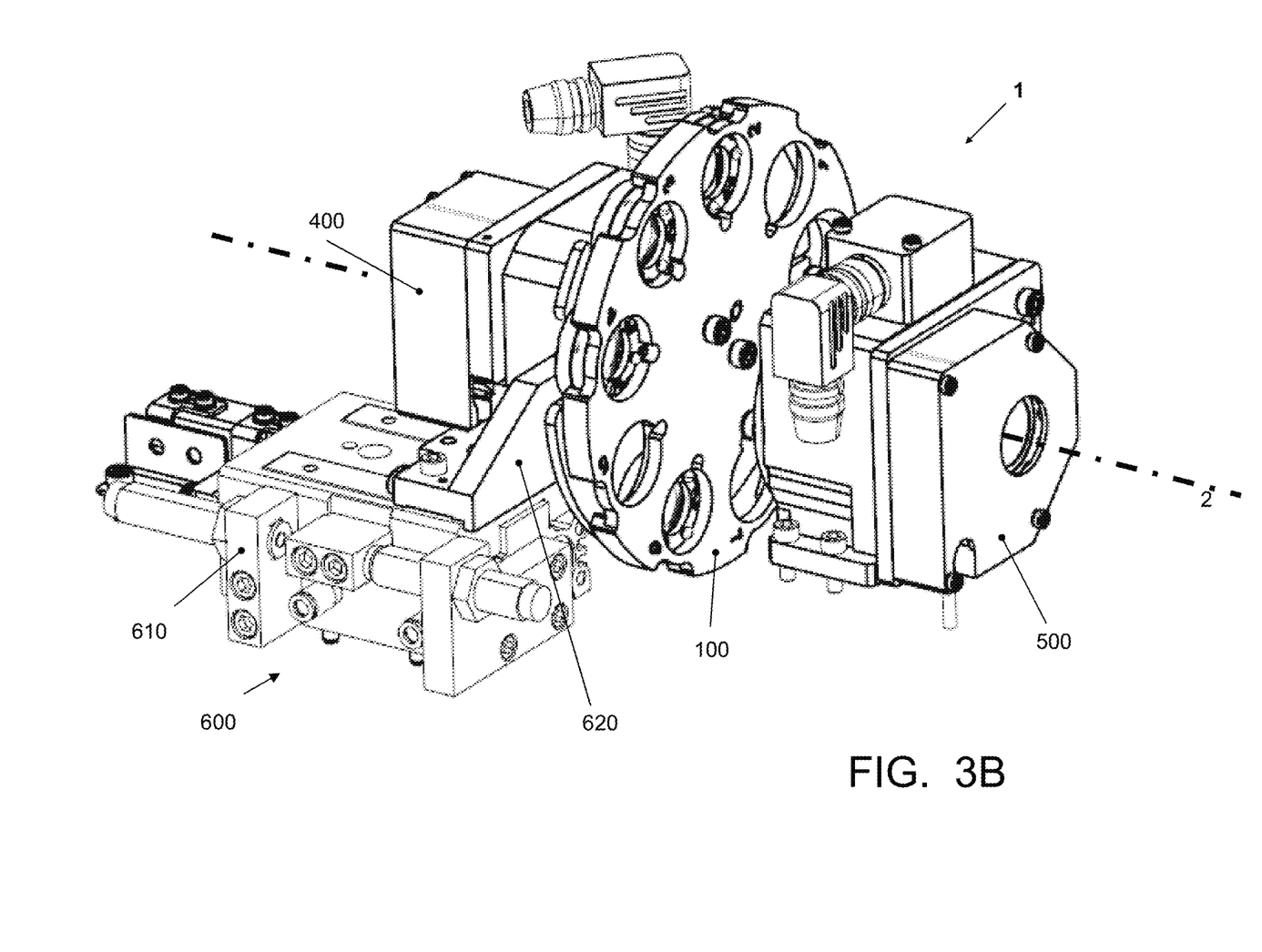
Figure 3C:
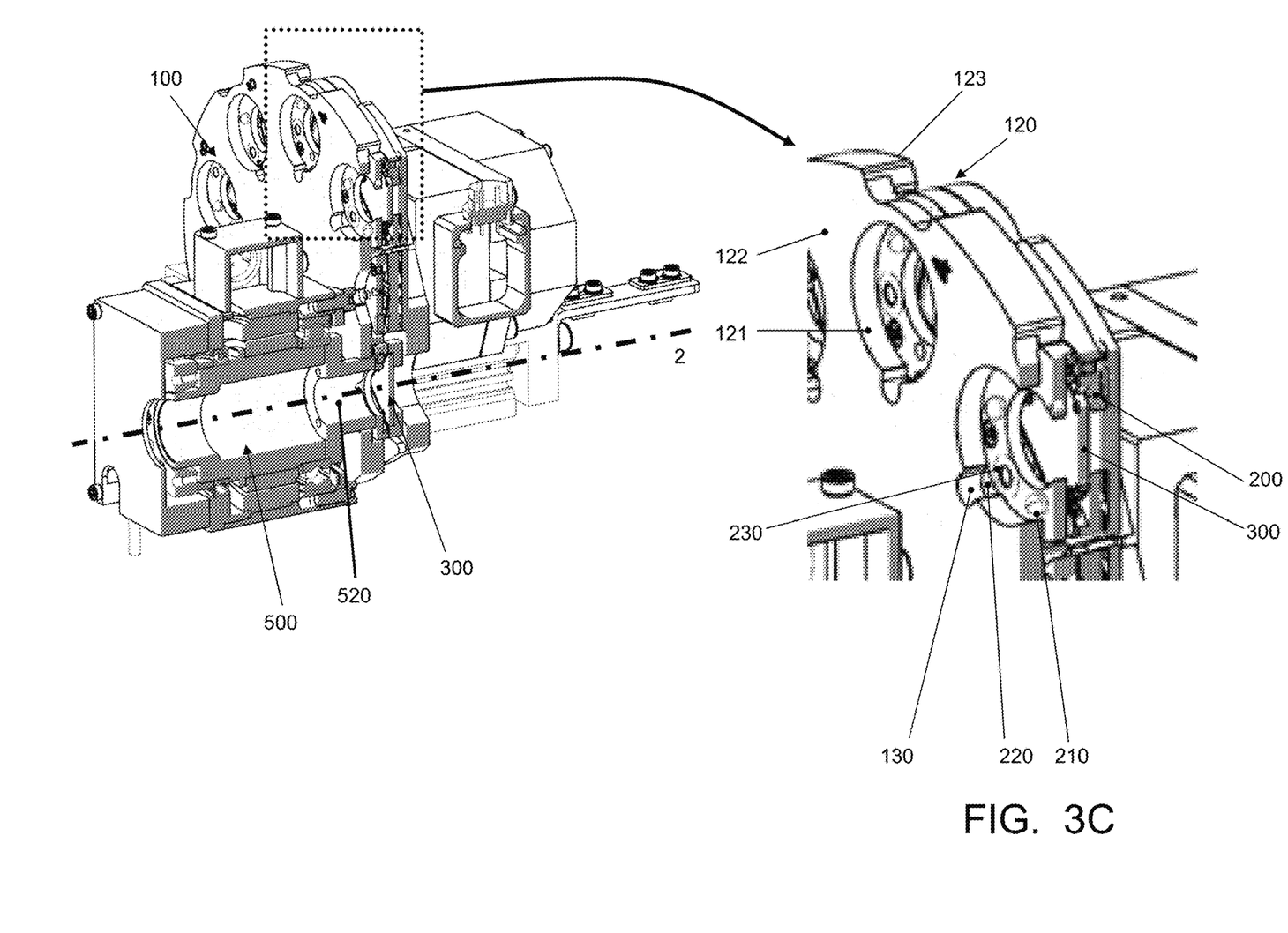
FIG. 3C is a schematic perspective view of the optical station of FIGS. 3A-B, partly cut open.

FIG. 3B is a schematic perspective view of the optical station 1 from the opposite side. FIG. 3C is a schematic perspective view of the optical station 1, partly cut open.

The optical station 1 comprises a magazine 100 accommodating a plurality of holders 200 that hold respective optical elements 300. The optical nature of the optical elements 300 is not relevant for explaining the invention. Reference numeral 110 indicates a protection plate.

The magazine 100 has a plurality of, i.e. two or more, accommodation spaces 120 (see FIGS. 3C and 6C) for accommodating the holders 200, each holder being accommodated in a corresponding one of the accommodation spaces. The magazine 100 has a general disc-shape, and is arranged in a virtual plane perpendicular to the positioning axis 2. In the following, the positioning axis 2 will be taken as a Z-axis, hence said plane will be an XY-plane. The accommodation spaces 120 are located at a circle that intersects the positioning axis 2. The magazine 100 is capable of rotating about a revolution axis that intersects the center of said circle and that is parallel to the positioning axis 2. Reference numeral 400 indicates a magazine XY-actuator for rotating the magazine about said revolution axis. Rotating the magazine 100 will make the various accommodation spaces 120 pass the positioning axis 2. Stopping the magazine 100 at a suitable angular position will align a selected one of the accommodation spaces 120 with the positioning axis 2.

The optical station 1 comprises a positioning device 500 that comprises a rotatable holder clamp 520. The positioning device 500 comprises rotating means for rotating the holder clamp 520 about a clamp rotation axis that coincides with the positioning axis 2.

The surface of the magazine 100 directed towards the positioning device 500 will be indicated as front face 122, while the opposite surface will be indicated as rear face 123. At the side of the rear face 123, each accommodation space 120 comprises a recess 124. Each accommodation space 120 further comprises a through hole 121 from the front face 122 to the recess 124, the recess being wider than the through hole 121. The transition 125 from the through hole 121 to the recess 124 forms a support ring for supporting a holder 200 (see FIGS. 6A-C).

Each holder 200 is ring-shaped, its central part being open for passing the laser beam.

It is desired that the holders 200 are retained in the respective accommodation spaces 120. For that purpose, retaining members are provided. Preferably, such retaining members include at least one magnetic member, more preferably a permanent magnet. The retaining members may be attached to the magazine 100, or to the holder 200, or both. FIG. 3C illustrates a magnet 210 attached to a holder 200, at that side of the holder 200 which is directed to the magazine 100.

In principle, a holder could have any angular orientation in the accommodation space 120. It is however desirable that a holder has one specific reference orientation in the accommodation space 120. Therefore, each holder 200 is provided with first type reference members that define a reference orientation of the holder with respect to the corresponding accommodation space. In the embodiment shown, such first type reference members comprise at least one pin 220 projecting towards the support ring of the accommodation space 120, which has a corresponding recess 130 for receiving said pin 220 if the holder 200 has the correct angular position.

Although not essential, yet preferred for easy exchange of holders from the magazine, each accommodation space 120 has a radial opening towards the perimeter of the magazine disc. Detaching a holder from the magazine is easy because an operator only has to overcome the attraction force of the magnetic retaining members. Placing a replacement holder in the magazine is easy because the operator only needs to mount the holder in roughly the correct orientation: the first type reference members will automatically make the holder assume the right orientation. If the orientation on mounting deviates too much from the correct orientation, the first type reference members will not allow the holder to be accepted by the magazine at all.

Figure 4:
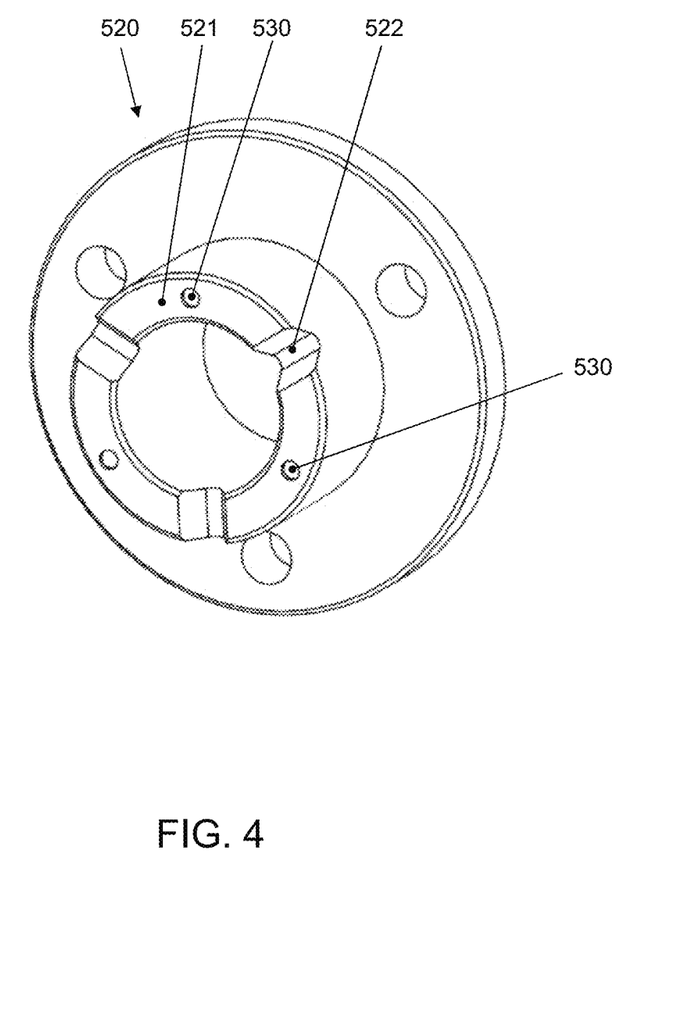
FIG. 4 is a schematic perspective view of an embodiment of a holder clamp.

FIG. 4 schematically shows a perspective view of a preferred embodiment of a holder clamp 520. This holder clamp 520 has a substantially cylindrical shape with a front face 521. The holder clamp 520 has a rotational symmetry, and its rotational axis is aligned with the positioning axis 2. In order to assure that the holder 200 is automatically correctly aligned with the positioning axis 2, the clamp's front face 521 is provided with a plurality of radial grooves 522, the number of grooves preferably being equal to three and their mutual angular distance preferably being equal to 120°. Matching with these grooves, the holder 200 is provided with second type reference members 230, which preferably are shaped as balls or pins with a top-surface in the shape of a semi-ball. The grooves 522 preferably have, at least partially, a V-shape. When the holder 200 mates with the holder clamp 520, the second type reference members 230 find their way towards the centres of the respective grooves 522. A slight misalignment of perhaps 5° will be automatically corrected by the second type reference members 230 being forced to the centres of the sloping walls of the grooves 522.

Figure 5:
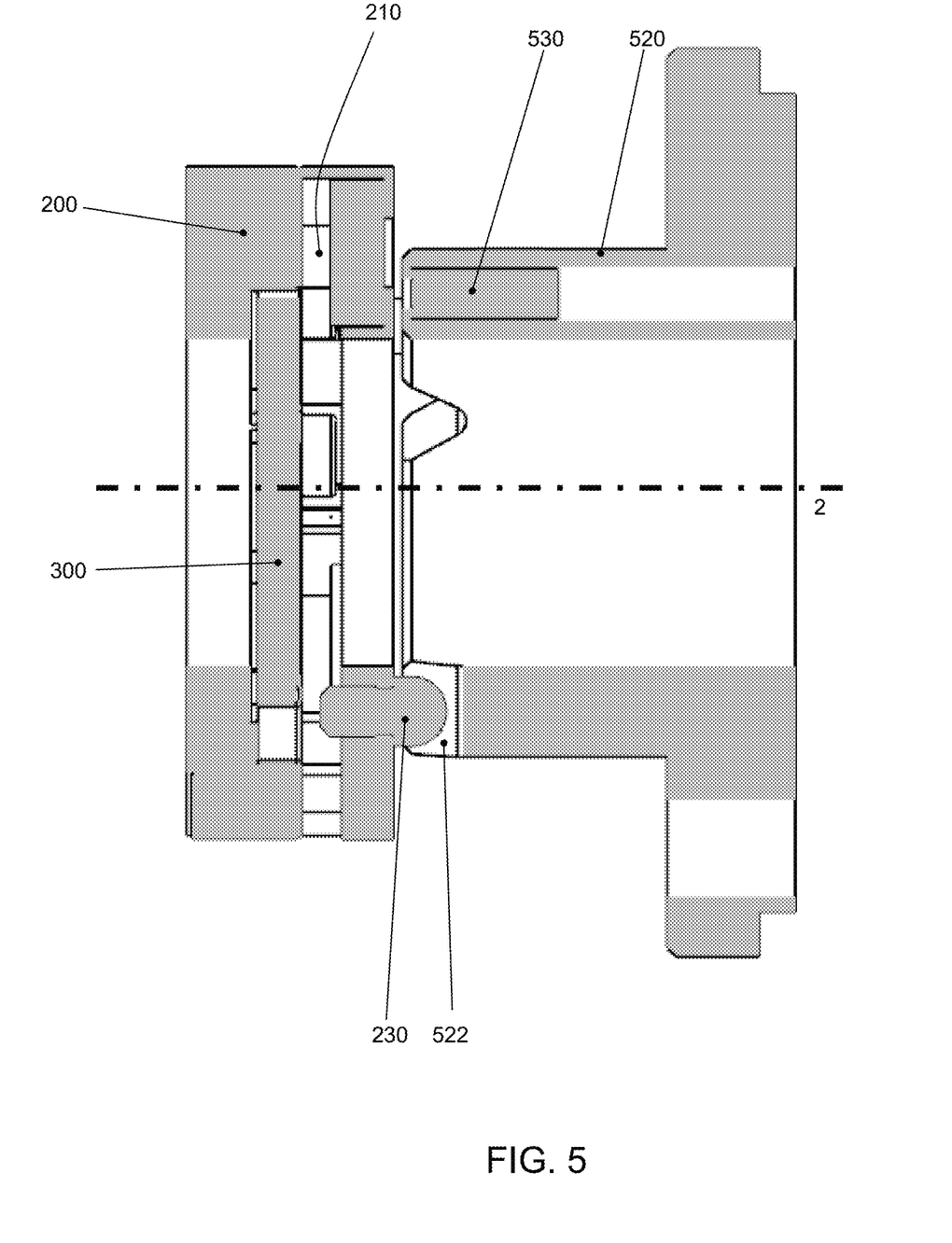
FIG. 5 is a cross sectional view of a holder clamped by a holder clamp.

FIG. 5 shows the holder clamp 520 clamping a holder 200 with optical element 300. It can be seen that the holder 200 has an annular shape with an outer diameter and an inner diameter defining an optical opening for passing the optical beam. It can be seen that the holder clamp 520 has an inner diameter corresponding to the inner diameter of the holder 200, or perhaps being slightly larger, and an outer diameter smaller than the outer diameter of the holder 200.

It is desired that the holder 200 is firmly pressed against the holder clamp 520. For that purpose, either the holder 200 or the holder clamp 520, or both, is/are provided with at least one magnetic member, preferably a permanent magnet. Advantageously, the same magnet 210 is used for this purpose. FIGS. 4 and 5 show that the holder clamp 520 can also be provided with magnets 530, for increasing the clamping force.

If the holder clamp 520 rotates, the form-closed coupling with the holder 200 will make the holder 200 rotate as well. Thus, a desired angular position of the holder 200 with respect to the positioning axis 2 can be set accurately. Owing to the low weight (low intertia) of the rotating mass, angular positioning can be done at a relatively high speed.

Reference numeral 600 (see FIGS. 3A and 3B) indicates a magazine Z-actuator. It comprises a base 610, which is intended to be fixed on a frame of the laser processing device, and a sledge 620 capable of being linearly displaced in the Z-direction. The magazine 100, together with its actuator 400, is mounted on said sledge 620. The sledge 620 can move between a proximate position in which the magazine 100 is closer to the positioning device 500, and a distal position in which the magazine 100 is further removed from the positioning device 500. It is noted that the positioning device 500 is also intended to be fixed on a frame of the laser processing device.

Operation of the optical station 1, directed by a control device that is not shown for sake of simplicity, is as follows.

Assume that the sledge 600 is in its distal position, so that the magazine 100 can rotate with respect to the positioning device 500. The magazine actuator 400 is controlled to rotate the magazine 100 to an angular position in which a selected one of the holders 200 is aligned with the positioning axis 2.

Then, the sledge 600 is controlled to shift to its proximate position. consequently, the magazine 100 is shifted towards the positioning device 500. The selected holder 200 meets the holder clamp 520, and upon further displacement of the magazine the holder clamp 520 lifts the holders 200 from the accommodation space. The holder is now free from the magazine 100. For positioning the corresponding optical element 300 is a desired operational angular position, the positioning device 500 only needs to rotate the relatively light-weight holder 200 plus optical element 300.

For exchanging one optical element with another optical element, first the positioning device 500 is rotated to a reference position, and the sledge 600 is shifted to its distal position, so that the holder 200 is lifted from the holder clamp 520. Then, the magazine is rotated to another angular position, and the above steps are repeated.

Figure 6A:
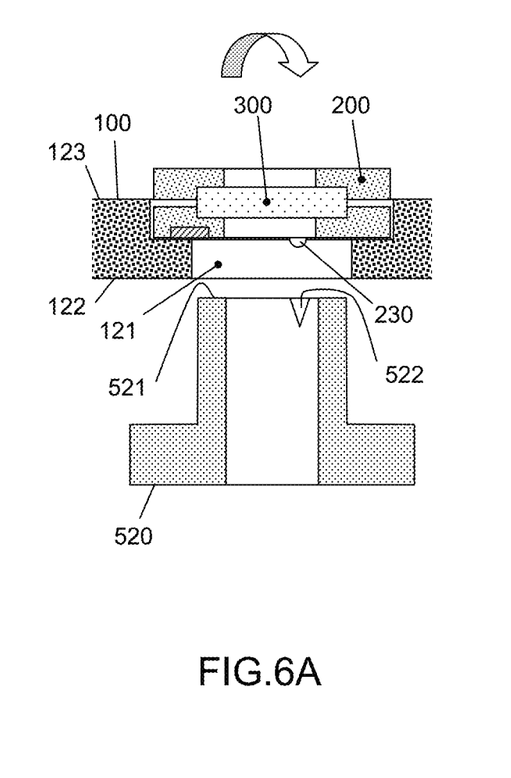
FIGS. 6A-6C are schematic cross sectional views illustrating the lifting of a holder.
Figure 6B:
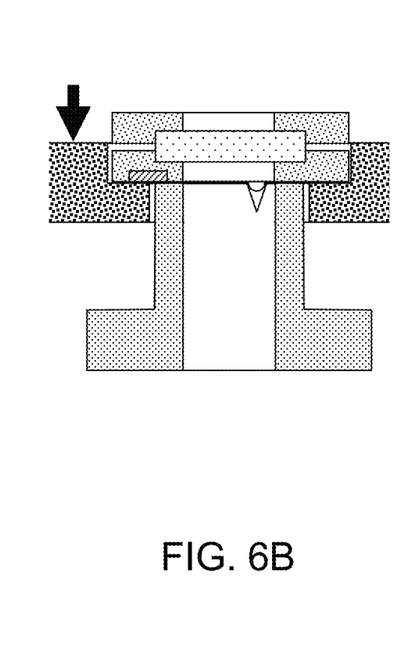
Figure 6C:
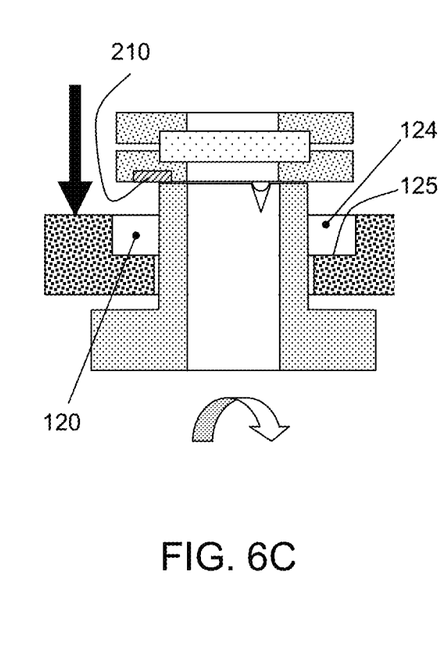

FIGS. 6A-C illustrate the lifting of a holder. In FIG. 6A, the magazine 100 is in its distal position, remote from the holder clamp 520. A holder 200 is located in an accommodation space 120, held in place by magnet 210. The magazine is free from the holder clamp 520, and can rotate to select a holder 200, as indicated by an arrow.

In FIG. 6B, the rotation of the magazine 100 has stopped. The holder clamp 520 is in a well-defined takeover position, with grooves 522 being aligned with balls comprised in the second type reference members 230. It can be seen that the outer diameter of the holder clamp 520 is smaller than the diameter of the through hole 121. The magazine 100 is shifted towards the holder clamp 520, as indicated by an arrow. The clamp 520 enters through hole 121, and the front face 521 of the holder clamp 520 touches the holder 200, with the balls seeking their position in the respective grooves 522. There is only one position where the holder 200 fits to the holder clamp 520, and this one position is automatically assumed due to the second type reference members 230 and 522. Thus, the required accuracy of positioning the optical element 300 in X-direction and Y-direction, and also in angular direction with respect to the holder clamp 520, is achieved directly after pick up of the holder from the magazine.

In FIG. 6C, the magazine 100 is shifted further towards the holder clamp 520, to reach its proximate position. The holder clamp 520 has lifted the holder 200 from the accommodation space 120. The holder 200 is kept in place on the front face 510 by magnet 210, i.e. the accurate position of the optical element 300 is maintained by static magnetic force. The length of the holder clamp 520 is larger than the thickness of the magazine 100, so that the holder 200 is now free from the magazine 100. The holder clamp 520 can now rotate to accurately position the holder 200 with the optical element 300 in a required angular position with respect to the optical axis, as indicated by an arrow. This positioning can be done quickly with relatively high rotation speed, since the holders 200 are relatively small and have relatively low inertia.

Figure 7A:
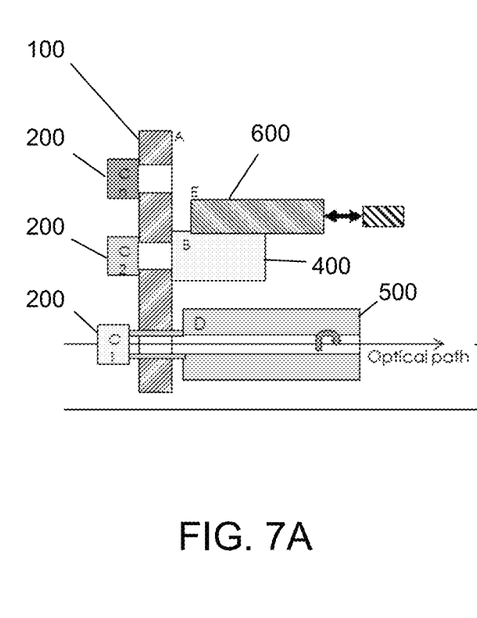
FIGS. 7A-7C are sketches schematically illustrating the operation of the station according to the present invention.
Figure 7B:
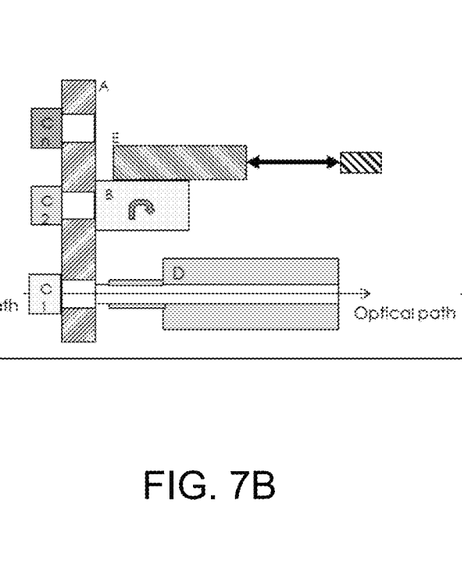
Figure 7C:
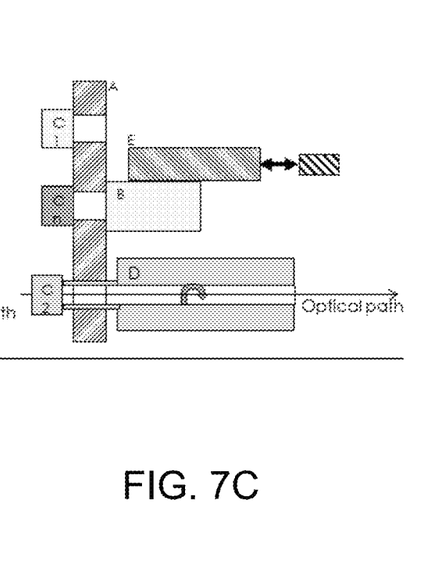

FIGS. 7A-C are schematic illustrations comparable to FIGS. 2A-D, illustrating the exchange of optical elements according to the invention. In FIG. 7A, a first holder C1 is operationally coupled to positioning device 500, lifted from the magazine 100. For changing a holder, the holder clamp 520 is rotated to its takeover position, and the magazine is displaced axially to its distal position (see FIGS. 6A and 7B) so that the magazine lifts the first holder C1 from the holder clamp, with the first type reference members 220, 130 aligned. The magazine is then rotated (see arrow in actuator 400 in FIG. 7B) to align a selected second holder C2, and then shifted back axially (FIGS. 6C and 7C) to have the second holder C2 be operationally coupled to positioning device 500. It can be seen that during the entire exchange operation the positioning device 500 stays in place with respect to the optical axis.

Summarizing, the present invention provides an optical station for a laser processing device; the station comprises:
a plurality of holders for holding respective optical elements;
a rotatable magazine having a plurality of accommodation spaces for accommodating the plurality of holders;
a positioning device having a holder clamp for clamping and positioning a selected one of the optical elements.
a magazine actuator for rotating the magazine;
linear shifting means for shifting the magazine in a direction parallel to the optical axis.

The magazine is shifted towards the positioning device such that the positioning device lifts the holder from its accommodation space.

It should be clear to a person skilled in the art that the present invention is not limited to the exemplary embodiments discussed above, but that several variations and modifications are possible within the protective scope of the invention as defined in the appending claims.

For instance, instead of having accommodation spaces arranged on one circle, the magazine may have two or more circles with accommodation spaces.

Further, instead of being a rotatable magazine having accommodation spaces arranged on a circle, the magazine may be an XY magazine having accommodation spaces arranged according to an XY grid, with the actuator 400 being an XY displacement actuator.

Further, it is possible that the holder clamp 520 is displaced in Z-direction with respect to the magazine, but preferably the holder clamp is stationary in Z-direction for improved accuracy.

Further, instead of a ball-groove mechanism for accurately positioning a holder with respect to the holder clamp, other self-seeking shapes may be used. Further, the positions of projection 230 and groove 522 may also be mirrored.

Even if certain features are recited in different dependent claims, the present invention also relates to an embodiment comprising these features in common. Any reference signs in a claim should not be construed as limiting the scope of that claim.

The invention claimed is:

1. An optical station for a laser processing device having an optical path, the optical station having a positioning axis that coincides with the optical path of the laser processing device in use, the optical station comprising:
   a plurality of holders for holding respective optical elements;
   a positioning device having a holder clamp for clamping and positioning a selected one of the holders such as to position the corresponding optical element in the optical path;
   a magazine having a plurality of accommodation spaces for accommodating the plurality of holders at a rear face of the magazine, the magazine further comprising a front face, opposite to the rear face, which is directed towards the positioning device, wherein the magazine is configured to be displaceable in a virtual XY-plane perpendicular to the positioning axis, and wherein the magazine and the holder clamp are configured to be displaceable with respect to each other in a Z-direction parallel to the positioning axis;
   a magazine XY-actuator for displacing the magazine perpendicular to the positioning axis with respect to the positioning device;
   a magazine Z-actuator for affecting a relative Z-displacement of the magazine and the holder clamp with respect to each other, between a relative distal extreme position and a relative proximal extreme position;
   wherein, when the magazine and the holder clamp are displaced to the relative distal extreme position, the magazine is operative to lift, in the Z direction, a holder from the holder clamp and is displaceable in the XY-direction to select another holder; and
   wherein, when the magazine and the holder clamp are displaced to the relative proximal extreme position, the holder clamp is operative to lift, in the Z direction, the selected holder from an accommodation space of the magazine for accurately positioning the selected holder with respect to the positioning axis.

2. The optical station according to claim 1, wherein the magazine is a planar magazine extending in said virtual XY-plane, and the accommodation spaces are distributed in said XY-plane.

3. The optical station according to claim 2, wherein the magazine is a rotatable disc-shaped magazine that is configured to rotate about a revolution axis that is parallel to the positioning axis, and the magazine XY-actuator is adapted for rotating the magazine about said revolution axis.

4. The optical station according to claim 3, wherein the accommodation spaces are located at a circle that intersects the positioning axis, said circle having a center coinciding with the revolution axis.

5. The optical station according to claim 1, wherein the holder clamp is rotatable for rotating a holder around the positioning axis; and wherein, when the magazine and the holder clamp are in the relative proximal extreme position, the holder clamp is operative to lift the selected holder from the magazine and is rotatable with the selected holder about the positioning axis.

6. The optical station according to claim 1, wherein each holder is provided with first type reference members and with second type reference members, wherein the first type reference members define a reference orientation of the holder with respect to the corresponding accommodation space, and wherein the second type reference members define a reference orientation of the holder with respect to the holder clamp.

7. The optical station according to claim 6, wherein each of the first type reference members comprises a mechanical protrusion cooperating with a recessed portion of a wall of the accommodation space.

8. The optical station according to claim 6, wherein the second type reference members include protrusions of the holder cooperating with radial grooves in a front face of the holder clamp, or wherein the second type reference members include radial grooves of the holder cooperating with protrusions on a front face of the holder clamp.

9. The optical station according to claim 1, wherein a holder is held in an accommodation space by first magnetic holding members.

10. The optical station according to claim 9, wherein the first magnetic holding members include permanent magnets.

11. The optical station according to claim 1, wherein a holder is held by the holder clamp by second magnetic holding members.

12. The optical station according to claim 11, wherein the second magnetic holding members include permanent magnets.

13. The optical station according to claim 1, wherein an accommodation space has a radial opening extending towards a perimeter of the magazine, for easy exchange of holders.

14. The optical station according to claim 1, which is adapted to perform an optical element exchange procedure:
   in a first step, when the magazine Z-actuator is in the relative proximal position, the positioning device rotates the holder clamp about the positioning axis to a predefined takeover position;
   in a subsequent second step, the magazine Z-actuator shifts from the relative proximal position to the relative distal position such that a free accommodation space contacts and lifts the holder held by the holder clamp from the holder clamp;
   in a subsequent third step, the magazine XY-actuator displaces the magazine to another position in which a selected other one of the holders is aligned with the positioning axis;
   in a subsequent fourth step, the magazine Z-actuator shifts from the relative distal position to the relative proximal position such that the holder clamp contacts the holder corresponding to the selected other one of the optical elements and lifts the holder corresponding to the selected other one of the optical elements from its accommodation space.

15. A laser processing apparatus comprising an optical station according to claim 1, wherein the laser processing apparatus is a semiconductor laser grooving apparatus or a semiconductor laser dicing apparatus for grooving/dicing of wafers.

16. The optical station according to claim 14, further comprising, in a subsequent fifth step in the optical element placement procedure, controlling the positioning device for rotating the holder clamp with the optical element about the positioning axis.

17. The optical station according to claim 1, wherein, in the proximal extreme position, the holder clamp enters the accommodation space.

* * * * *